(12) United States Patent
Sun et al.

(10) Patent No.: US 9,577,104 B2
(45) Date of Patent: Feb. 21, 2017

(54) COA SUBSTRATE AND LIQUID CRYSTAL DISPLAY PANEL

(71) Applicant: SHENZHEN CHINA STAR OPTOELECTRONICS TECHNOLOGY CO., LTD, Shenzhen (CN)

(72) Inventors: Bo Sun, Shenzhen (CN); XiaoLing Zou, Shenzhen (CN)

(73) Assignee: SHENZHEN CHINA STAR OPTOELECTRONICS TECHNOLOGY CO., LTD, Shenzhen (CN)

( * ) Notice: Subject to any disclaimer, the term of this patent is extended or adjusted under 35 U.S.C. 154(b) by 31 days.

(21) Appl. No.: 14/411,919

(22) PCT Filed: Nov. 19, 2014

(86) PCT No.: PCT/CN2014/091585
§ 371 (c)(1),
(2) Date: Dec. 30, 2014

(87) PCT Pub. No.: WO2016/074262
PCT Pub. Date: May 19, 2016

(65) Prior Publication Data
US 2016/0131930 A1 May 12, 2016

(30) Foreign Application Priority Data
Nov. 11, 2014 (CN) .......................... 2014 1 0629739

(51) Int. Cl.
*G02F 1/1337* (2006.01)
*H01L 29/786* (2006.01)
(Continued)

(52) U.S. Cl.
CPC ... *H01L 29/78669* (2013.01); *G02F 1/136227* (2013.01); *H01L 27/124* (2013.01);
(Continued)

(58) Field of Classification Search
CPC ............... G02F 2001/136222; G02F 1/133707
See application file for complete search history.

(56) References Cited

U.S. PATENT DOCUMENTS 6,373,540 B1 * 4/2002 Munakata ........... G02F 1/13725
349/110
8,379,174 B2 * 2/2013 Luo ................... G02F 1/133555
349/113
(Continued)

FOREIGN PATENT DOCUMENTS

CN 102213874 A 10/2011
CN 102402042 A 4/2012
CN 102436093 A 5/2012

*Primary Examiner* — Kendrick Hsu
(74) *Attorney, Agent, or Firm* — Mark M. Friedman

(57) ABSTRACT

A COA substrate is provided including a substrate base, a first metal layer, a first insulating layer, a semiconductor layer, a second metal layer, a color resist layer, and a pixel electrode layer. The surface of the color resist layer is provided with a protrusion and a recess, and the pixel electrode is disposed on the protrusion and the recess. A plurality of protrusions and a plurality of recesses are provided, thereby increasing the display quality of a liquid crystal display device.

13 Claims, 3 Drawing Sheets

(51) Int. Cl.
*G02F 1/1362* (2006.01)
*H01L 27/12* (2006.01)

(52) U.S. Cl.
CPC ............... *G02F 1/133707* (2013.01); *G02F 2001/136222* (2013.01)

(56) References Cited

U.S. PATENT DOCUMENTS

| | | | |
|---|---|---|---|
| 2006/0050211 A1* | 3/2006 | Kim | ............ G02F 1/133555 349/114 |
| 2007/0182888 A1 | 8/2007 | Inoue et al. | |
| 2011/0242468 A1* | 10/2011 | Choi | ............ C08G 8/12 349/129 |
| 2011/0317104 A1 | 12/2011 | Nakamura et al. | |
| 2013/0107180 A1 | 5/2013 | Xiao et al. | |

* cited by examiner

COA SUBSTRATE AND LIQUID CRYSTAL DISPLAY PANEL

FIELD OF THE INVENTION

The present invention relates to a field of liquid crystal displays, and particularly to a COA substrate and a liquid crystal display panel.

BACKGROUND OF THE INVENTION

With the development of science and technology, the use of the liquid crystal display devices is becoming more and more extensive. For improving the presentation of colors on the liquid crystal display device, a layer of color film is provided on an array substrate of a conventional liquid crystal display device, so that three primary colors RGB can be realized on the array substrate, and an alignment operation between the array substrate and the color film substrate can be eliminated, so as to get a better presentation of full-colors on the liquid crystal display device. The above technique is called COA (Color Filter on array) technique.

FIG. 1 shows a schematic diagram of a conventional COA substrate. A pixel electrode 12 is directly formed on a color filter 11. After a backlight passes through the COA substrate, three-color lights RGB are thus formed.

In order to prevent the crosstalk phenomenon when a liquid crystal display device is working, the pixel electrode 12 of the COA substrate will comprise a plurality of regions which are formed with different extending angles, thereby achieving a multi-domain display. As shown in FIG. 1, a pixel electrode region and an interval region 13 must necessarily exist in the COA substrate. When the above-mentioned liquid crystal display device is working, an electric field intensity sensed by the liquid crystal molecules corresponding to the interval region 13 of the COA substrate is weaker, so that the light penetration rate of a display region corresponding to the interval region 13 is decreased, thereby affecting the display quality of the liquid crystal display device.

Accordingly, it is necessary to provide a COA substrate and a crystal display panel to solve the above technical problems.

SUMMARY OF THE INVENTION

An object of the present invention is to provide a COA substrate and a liquid crystal display panel comprising a color resist layer which has a plurality of protrusions and a plurality of recesses, so as to solve the conventional technical problems caused by the low light penetration rate of a display region and low display quality.

In order to solve the above-mentioned problems, the technical solution of the present invention is as follows:

An embodiment of the present invention provides a COA substrate comprising:

A substrate base;

A first metal layer disposed on the substrate base for forming a scan line and a gate region of a thin film field effect transistor;

A first insulating layer disposed on the first metal layer;

A semiconductor layer disposed on the first insulating layer for forming a channel of the thin film field effect transistor;

A second metal layer disposed on the semiconductor layer for forming a source region of the thin film field effect transistor, a drain region of the thin film field effect transistor, and a data line;

A color resist layer disposed on the second metal layer and the first insulating layer for forming a color fitter and A pixel electrode layer disposed on the color resist layer and connected with the drain region of the thin film field effect transistor via through-holes of the color resist layer for forming a pixel electrode.

A surface of the color resist layer is provided with at least one protrusion and at least one recess, and the pixel electrode is disposed on the protrusion and the recess. The pixel electrode corresponding to each pixel is an integrated pixel electrode which is correspondingly disposed on the color resist layer.

The color resist layer is patterned by using a half-tone mask to form the protrusion and the recess on the surface of the color resist layer.

In the COA substrate of the present invention, the protrusions and the recesses are arranged alternately with each other.

In the COA substrate of the present invention, the COA substrate comprises a plurality of displaying domains for preventing image crosstalk.

In the COA substrate of the present invention, the recess comprises a first sub-recess and a second sub-recess of different depths for disposing the pixel electrodes, so that the pixel electrode disposed in the first sub-recess and the pixel electrode disposed in the second sub-recess are located in the different displaying domains.

In the COA substrate of the present invention, the first sub-recess and the second sub-recess are arranged to be spaced apart.

Another embodiment of the present invention provides a COA substrate comprising:

A substrate base;

A first metal layer disposed on the substrate base for forming a scan line and a gate region of a thin film field effect transistor;

A first insulating layer disposed on the first metal layer;

A semiconductor layer disposed on the first insulating layer for forming a channel of the thin film field effect transistor;

A second metal layer disposed on the semiconductor layer for forming a source region of the thin film field effect transistor, a drain region of the thin film field effect transistor, and a data line;

A color resist layer disposed on the second metal layer and the first insulating layer for forming a color filter; and A pixel electrode layer disposed on the color resist layer and connected with the drain region of the thin film field effect transistor via through-holes of the color resist layer for forming a pixel electrode.

A surface of the color resist layer is provided with at least one protrusion and at least one recess, and the pixel electrode is disposed on the protrusion and the recess.

In the COA substrate of the present invention, the protrusions and the recesses are arranged alternately with each other.

In the COA substrate of the present invention, the COA substrate comprises a plurality of displaying domains for preventing image crosstalk.

In the COA substrate of the present invention, the recess comprises a first sub-recess and a second sub-recess of different depths for disposing the pixel electrodes, so that the pixel electrode disposed in the first sub-recess and the pixel electrode disposed in the second sub-recess are located in the different displaying domains.

In the COA substrate of the present invention, the first sub-recess and the second sub-recess are arranged to be spaced apart.

In the COA substrate of the present invention, the color resist layer is patterned by using a half-tone mask to form the protrusion and the recess on the surface of the color resist layer.

In the COA substrate of the present invention, the pixel electrode corresponding to each pixel is an integrated pixel electrode which is correspondingly disposed on the color resist layer.

Another embodiment of the present invention provides a liquid crystal display panel comprising a COA substrate, a glass substrate, and a liquid crystal layer disposed between the COA substrate and the glass substrate, where the COA substrate comprises:

A substrate base;

A first metal layer disposed on the substrate base for forming a scan line and a gate region of a thin film field effect transistor;

A first insulating layer disposed on the first metal layer;

A semiconductor layer disposed on the first insulating layer for forming a channel of the thin film field effect transistor;

A second metal layer disposed on the semiconductor layer for forming a source region of the thin film field effect transistor, a drain region of the thin film field effect transistor, and a data line;

A color resist layer disposed on the second metal layer and the first insulating layer for forming a color filter, and A pixel electrode layer disposed on the color resist layer and connected with the drain region of the thin film field effect transistor via through-holes of the color resist layer for forming a pixel electrode.

A surface of the color resist layer is provided with at least one protrusion and at least one recess, and the pixel electrode is disposed on the protrusion and the recess.

In the liquid crystal display panel of the present invention, the protrusions and the recesses are arranged alternately with each other.

In the liquid crystal display panel of the present invention, the COA substrate comprises a plurality of displaying domains for preventing image crosstalk.

In the liquid crystal display panel of the present invention, the recess comprises a first sub-recess and a second sub-recess of different depths for disposing the pixel electrodes, so that the pixel electrode disposed in the first sub-recess and the pixel electrode disposed in the second sub-recess are located in the different displaying domains.

In the liquid crystal display panel of the present invention, the first sub-recess and the second sub-recess are arranged to be spaced apart.

In the liquid crystal display panel of the present invention, in the color resist layer is patterned by using a half-tone mask to form the protrusion and the recess on the surface of the color resist layer.

In the liquid crystal display panel of the present invention, the pixel electrode corresponding to each pixel is an integrated pixel electrode which is correspondingly disposed on the color resist layer.

In comparison with the conventional COA substrate and liquid crystal display panel, a COA substrate and a liquid crystal display panel of the present invention are provided with a color resist layer which has a plurality of protrusions and a plurality of recesses, thereby increasing the light penetration rate of a display region and increasing the display quality of a liquid crystal display device, so as to solve the technical problems caused by the low light penetration rate of a display region and low display quality in the conventional liquid crystal display panel.

In order to make the present invention more clear, preferred embodiments, and the drawings thereof, are described in detail below.

DETAILED DESCRIPTION OF THE INVENTION

Figure 1:
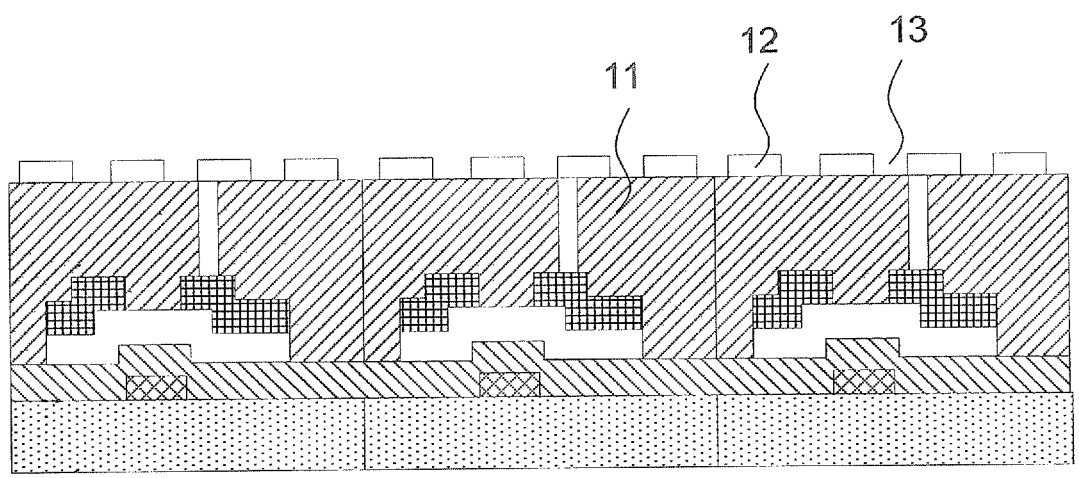
FIG. 1 shows a schematic diagram of a conventional COA substrate.

The following embodiments refer to the accompanying drawings for exemplifying specific implementable embodiments of the present invention. Furthermore, directional terms described by the present invention, such as upper, lower, front, back, left, right, inner, outer, side, etc., are only directions by referring to the accompanying drawings, and thus the used directional terms are used to describe and understand the present invention, but the present invention is not limited thereto.

In the drawings, the same reference symbol represents the same or a similar component.

Figure 2:
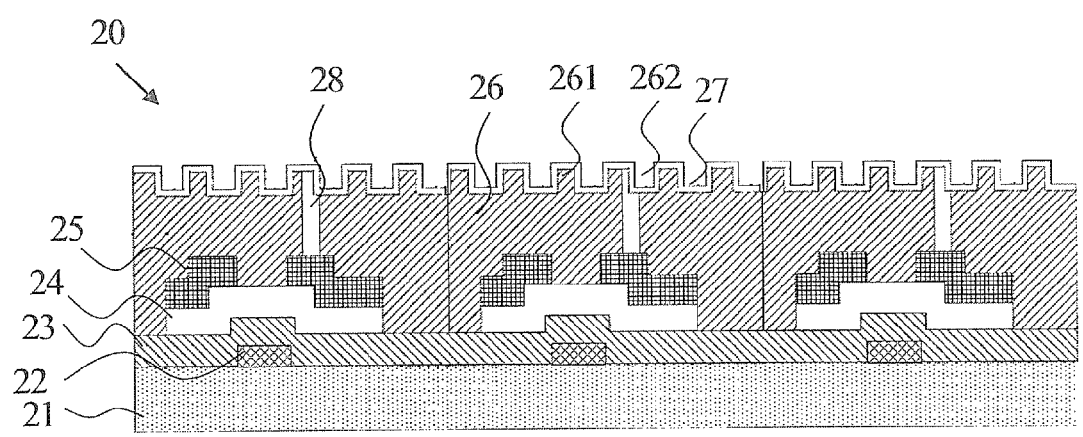
FIG. 2 shows a schematic diagram of a COA substrate according to a first preferred embodiment of the present invention.

Please refer to FIG. 2, which shows a schematic diagram of a COA substrate according to a first preferred embodiment of the present invention. The COA substrate 20 of the preferred embodiment comprises a substrate base 21, a first metal layer 22, a first insulating layer 23, a semiconductor layer 24, a second metal layer 25, a color resist layer 26, and a pixel electrode layer 27.

The first metal layer 22 is disposed on the substrate base 21 for forming a scan line and a gate region of a thin film field effect transistor. The material of the first metal layer 22 may be chromium, molybdenum, aluminum, copper, etc. The first insulating layer 23 is disposed on the first metal layer 22. The first insulating layer 23 may be a silicon nitride layer and so on. The semiconductor layer 24 is disposed on the first insulating layer 23 for forming a channel of the thin film field effect transistor. The semiconductor layer 24 may be an amorphous silicon layer. The second metal layer 25 is disposed on the semiconductor layer 24 for forming a source region and a drain region of the thin film field effect transistor and a data line. The material of the second metal layer 25 may be chromium, molybdenum, aluminum, copper, etc. The color resist layer 26 is disposed on the second metal layer 25 and the first insulating layer 23 for forming a color filter (such as red, green, and blue color resists and a black matrix). The pixel electrode layer 27 is disposed on the color resist layer 26 and connected with the drain region of the thin film field effect transistor via through-holes 28 of the color resist layer 26 for forming a pixel electrode. The material of the pixel electrode layer 27 may be indium tin oxide or indium oxide zinc, etc.

As shown in FIG. 2, the surface of the color resist layer 26 of the COA substrate 20 of the preferred embodiment is provided with a plurality of protrusions 261 and a plurality of recesses 262 which are connected with each other, and the pixel electrode is integrated and disposed on the color resist layer 26 corresponding to a same pixel. The color resist layer 26 is patterned by using a half-tone mask for forming the protrusions 261 and the recesses 262 on the surface of the color resist layer 26. The protrusions 261 and the recesses 262 are arranged to be spaced apart, thereby forming a sawtooth groove on an upper surface of the color resist layer 26. An integrated pixel electrode is formed on the surface of the protrusions 261 and the recesses 262; openings are thus naturally formed by the recesses 262. Moreover, since the pixel electrode is also formed inside the recess 262, the control efficiency of the liquid crystal and the utilization ratio of the backlight are increased. Furthermore, since the integrated pixel electrode is formed on the surface of the color resist layer 26, the actual area of the pixel electrode is increased, also the liquid crystal capacitance is increased, thereby decreasing a whole feedthrough voltage (Vft) of the panel.

In using the COA substrate 20 of the preferable embodiment, since the integrated pixel electrode is disposed on the color resist layer 26 corresponding to each pixel, the liquid crystal molecules corresponding to a region of the recess 262 of the color resist layer 26 can sense a greater electric field intensity, thereby significantly increasing the control efficiency of the liquid crystal molecules on the region and increasing the light penetration rate of the region. Besides, according to the shape of the protrusion 261, electric fields in different directions are generated on the region of the protrusion 261 of the color resist layer 26, thereby effectively forming a multi-domain display, so that the generation of the crosstalk phenomenon is prevented.

Therefore, the COA substrate of the preferable embodiment is provided with a color resist layer which has a plurality of protrusions and a plurality of recesses, so as to increase the control efficiency of the liquid crystal molecules corresponding to a region of the recesses, thereby increasing the light penetration rate of a display region and increasing the display quality of a liquid crystal display device.

Figure 3:
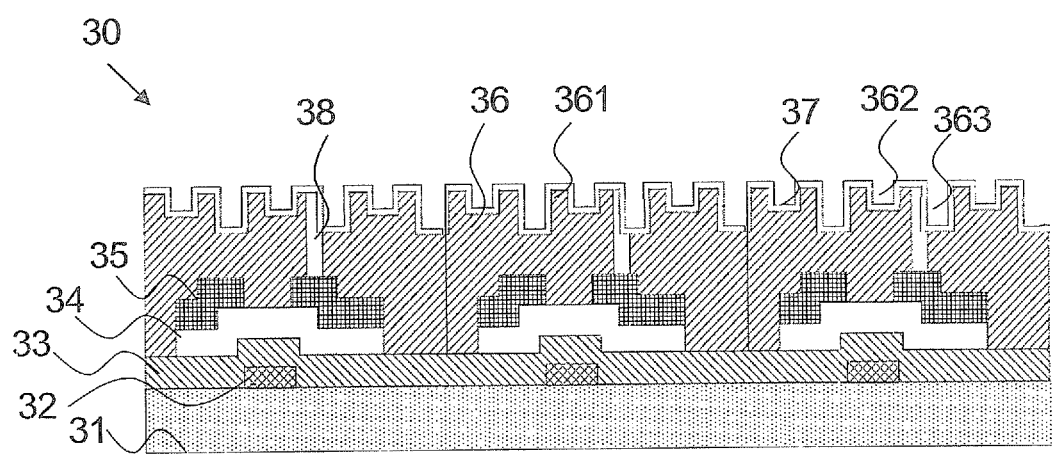
FIG. 3 shows a schematic diagram of a COA substrate according to a second preferred embodiment of the present invention.

Please refer to FIG. 3, which shows a schematic diagram of a COA substrate according to a second preferred embodiment of the present invention. The COA substrate 30 of the preferred embodiment comprises a substrate base 31, a first metal layer 32, a first insulating layer 33, a semiconductor layer 34, a second metal layer 35, a color resist layer 36, and a pixel electrode layer 37.

The first metal layer 32 is disposed on the substrate base 31 for forming a scan line and a gate region of a thin film field effect transistor. The material of the first metal layer 32 may be chromium, molybdenum, aluminum, copper, etc. The first insulating layer 33 is disposed on the first metal layer 32. The first insulating layer 33 may be a silicon nitride layer and so on. The semiconductor layer 34 is disposed on the first insulating layer 33 for forming a channel of the thin film field effect transistor. The semiconductor layer 34 may be an amorphous silicon layer. The second metal layer 35 is disposed on the semiconductor layer 34 for forming a source region and a drain region of the thin film field effect transistor and a data line. The material of the second metal layer 35 may be chromium, molybdenum, aluminum, copper, etc. The color resist layer 36 is disposed on the second metal layer 35 and the first insulating layer 33 for forming a color filter (such as red, green, and blue color resists and a black matrix). The pixel electrode layer 37 is disposed on the color resist layer 36 and is connected with the drain region of the thin film field effect transistor via through-holes 38 of the color resist layer 36 for forming a pixel electrode. The material of the pixel electrode layer 37 may be indium tin oxide or indium oxide zinc, etc.

The surface of the color resist layer 36 of the COA substrate 30 of the preferred embodiment is provided with a plurality of protrusions 361 and a plurality of recesses 362 which are connected with each other, and the pixel electrode is integrated and disposed on the color resist layer 36 corresponding to a same pixel. Based on the first preferred embodiment, the recesses of the color resist layer 36 of the COA substrate 30 of the preferred embodiment comprise first sub-recesses 362 and second sub-recesses 363 of different depths for disposing the pixel electrodes. As shown in FIG. 3, the first sub-recess 362 and the second sub-recess 363 are arranged to be spaced apart. The color resist layer 36 is patterned by using a half-tone mask for forming the protrusion 361, the first sub-recess 362, and the second sub-recess 363 on the surface of the color resist layer 36, and then an integrated pixel electrode is formed on the surface of the color resist layer 36.

In using the COA substrate 30 of the preferable embodiment, since the integrated pixel electrode is disposed on the color resist layer 36 corresponding to each pixel, the liquid crystal molecules corresponding to a region of the recesses of the color resist layer 36 can sense a greater electric field intensity, thereby significantly increasing the control efficiency of the liquid crystal molecules on the region and increasing the light penetration rate of the region. Besides, the recesses comprise the first sub-recesses 362 and the second sub-recess 363 which are arranged to be spaced apart. Since the depths of the first sub-recess 362 and the second sub-recess 363 are different, the electric field intensities corresponding to the region of the first sub-recess 362 and the region of second sub-recess 363 are also different, so that the deflection angle of the liquid crystal molecules corresponding to the region of the first sub-recess 362 and the region of second sub-recess 363 are different under the same driving voltage. Therefore, without providing a dual sub-pixel to the COA substrate 30 of the preferable embodiment, an eight-domain display is achieved. Furthermore, the generation of the crosstalk phenomenon is prevented. Moreover, the resolution of the liquid crystal display device can be increased by using a single sub-pixel to display.

Based on the first preferred embodiment, the COA substrate of the preferred embodiment is provided with first sub-recesses and second sub-recesses of different depths for disposing the pixel electrodes, so that the generation of the crosstalk phenomenon is prevented, and the resolution of the liquid crystal display device is increased.

The present invention further provides a liquid crystal display panel. The liquid crystal display panel comprises a COA substrate, a glass substrate, and a liquid crystal layer disposed between the COA substrate and the glass substrate, where the COA substrate comprises a substrate base, a first metal layer, a first insulating layer, a semiconductor layer, a second metal layer, a color resist layer, and a pixel electrode layer. The first metal layer is disposed on the substrate base for forming a scan line and a gate region of a thin film field effect transistor. The first insulating layer is disposed on the first metal layer. The semiconductor layer is disposed on the first insulating layer for forming a channel of the thin film field effect transistor. The second metal layer is disposed on the semiconductor layer for forming a source region and a drain region of the thin film field effect transistor and a data line. The color resist layer is disposed on the second metal layer and the first insulating layer for forming a color fitter. The pixel electrode layer is disposed on the color resist layer and connected with the drain region of the thin film field effect transistor via through-holes of the color resist layer for forming a pixel electrode.

Preferably, recesses of the color resist layer may comprise first sub-recesses and second sub-recesses of different depths for disposing the pixel electrodes, so that the pixel electrode disposed in the first sub-recess and the pixel electrode disposed in the second sub-recess are located in the different displaying domains.

Preferably, the first sub-recess and the second sub-recess are arranged to be spaced apart.

Preferably, the color resist layer is patterned by using a half-tone mask for forming the protrusions and the recesses on the surface of the color resist layer.

Preferably, the pixel electrode corresponding to each pixel is an integrated pixel electrode which is correspondingly disposed on the color resist layer.

The specific working principle of the liquid crystal display panel of the preferred embodiment is same as or similar to the above-mentioned COA substrate of the preferred embodiment. For details, reference is made to the description about the above-mentioned COA substrate of the preferred embodiment.

The COA substrate and the liquid crystal display panel of the present invention are provided with a color resist layer which has a plurality of protrusions and a plurality of recesses, thereby increasing the light penetration rate of a display region and increasing the display quality of a liquid crystal display device, so as to solve the technical problems caused by the low light penetration rate of a display region and low display quality in the conventional liquid crystal display panel.

The above descriptions are merely preferable embodiments of the present invention, but are not intended to limit the scope of the present invention. Any modification or replacement made by those skilled in the art without departing from the spirit and principle of the present invention should fall within the protection scope of the present invention. Therefore, the protection scope of the present invention is subject to the appended claims.

What is claimed is:

1. A COA substrate, comprising:
a substrate base;
a first metal layer disposed on the substrate base for forming a scan line and a gate region of a thin film field effect transistor;
a first insulating layer disposed on the first metal layer;
a semiconductor layer disposed on the first insulating layer for forming a channel of the thin film field effect transistor;
a second metal layer disposed on the semiconductor layer for forming a source region of the thin film field effect transistor, a drain region of the thin film field effect transistor, and a data line;
a color resist layer disposed on the second metal layer and the first insulating layer for forming a color filter; and
a pixel electrode layer disposed on the color resist layer and connected with the drain region of the thin film field effect transistor via through-holes of the color resist layer for forming a pixel electrode;
wherein a surface of the color resist layer in contact with the pixel electrode layer is provided with at least one protrusion and at least one recess, and the pixel electrode is disposed on the at least one protrusion and the at least one recess; the pixel electrode corresponding to each pixel is an integrated pixel electrode which is correspondingly disposed on the color resist layer;
wherein the color resist layer is patterned by using a half-tone mask to form the at least one protrusion and the at least one recess on the surface of the color resist layer;
wherein the COA substrate comprises a plurality of displaying domains for preventing image crosstalk; and
wherein the at least one recess comprises a first sub-recess and a second sub-recess of different depths for disposing the pixel electrodes, so that the pixel electrode disposed in the first sub-recess and the pixel electrode disposed in the second sub-recess are located in the different displaying domains.

2. The COA substrate according to claim 1, wherein the at least one protrusion and the at least one recess are arranged alternately with each other.

3. The COA substrate according to claim 1, wherein the first sub-recess and the second sub-recess are arranged to be spaced apart.

4. A COA substrate, comprising:
a substrate base;
a first metal layer disposed on the substrate base for forming a scan line and a gate region of a thin film field effect transistor;
a first insulating layer disposed on the first metal layer;
a semiconductor layer disposed on the first insulating layer for forming a channel of the thin film field effect transistor;
a second metal layer disposed on the semiconductor layer for forming a source region of the thin film field effect transistor, a drain region of the thin film field effect transistor, and a data line;
a color resist layer disposed on the second metal layer and the first insulating layer for forming a color filter; and
a pixel electrode layer disposed on the color resist layer and connected with the drain region of the thin film field effect transistor via through-holes of the color resist layer for forming a pixel electrode;
wherein a surface of the color resist layer in contact with the pixel electrode layer is provided with at least one protrusion and at least one recess, and the pixel electrode is disposed on the at least one protrusion and the at least one recess;
wherein the COA substrate comprises a plurality of displaying domains for preventing image crosstalk; and
wherein the at least one recess comprises a first sub-recess and a second sub-recess of different depths for disposing the pixel electrodes, so that the pixel electrode disposed in the first sub-recess and the pixel electrode disposed in the second sub-recess are located in the different displaying domains.

5. The COA substrate according to claim 4, wherein the at least one protrusion and the at least one recess are arranged alternately with each other.

6. The COA substrate according to claim 4, wherein the first sub-recess and the second sub-recess are arranged to be spaced apart.

7. The COA substrate according to claim 4, wherein the color resist layer is patterned by using a hall-tone mask to form the at least one protrusion and the at least one recess on the surface of the color resist layer.

8. The COA substrate according to claim 4, wherein the pixel electrode corresponding to each pixel is an integrated pixel electrode which is correspondingly disposed on the color resist layer.

9. A liquid crystal display panel, comprising a COA substrate, a glass substrate, and a liquid crystal layer disposed between the COA substrate and the glass substrate, wherein the COA substrate comprises:
- a substrate base;
- a first metal layer disposed on the substrate base for forming a scan line and a gate region of a thin film field effect transistor;
- a first insulating layer disposed on the first metal layer;
- a semiconductor layer disposed on the first insulating layer for forming a channel of the thin film field effect transistor;
- a second metal layer disposed on the semiconductor layer for forming a source region of the thin Film field effect transistor, a drain region of the thin film field effect transistor, and a data line;
- a color resist layer disposed on the second metal layer and the first insulating layer for forming a color filter; and
- a pixel electrode layer disposed on the color resist layer and connected with the drain region of the thin film field effect transistor via through-holes of the color resist layer for forming a pixel electrode;
- wherein a surface of the color resist layer in contact with the pixel electrode layer is provided with at least one protrusion and at least one recess, and the pixel electrode is disposed on the at least one protrusion and the at least one recess;
- wherein the COA substrate comprises a plurality of displaying domains for preventing image crosstalk; and
- wherein the at least one recess comprises a first sub-recess and a second sub-recess of different depths for disposing the pixel electrodes, so that the pixel electrode disposed in the first sub-recess and the pixel electrode disposed in the second sub-recess are located in the different displaying domains.

10. The liquid crystal display panel according to claim 9, wherein the at least one protrusion and the at least one recess are arranged alternately with each other.

11. The liquid crystal display panel according to claim 9, wherein the first sub-recess and the second sub-recess are arranged to be spaced apart.

12. The liquid crystal display panel according to claim 9, wherein the color resist layer is patterned by using a half-tone mask to form the at least one protrusion and the at least one recess on the surface of the color resist layer.

13. The liquid crystal display panel according to claim 9, wherein the pixel electrode corresponding to each pixel is an integrated pixel electrode which is correspondingly disposed on the color resist layer.

* * * * *

UNITED STATES PATENT AND TRADEMARK OFFICE
CERTIFICATE OF CORRECTION

PATENT NO.       : 9,577,104 B2
APPLICATION NO.  : 14/411919
DATED            : February 21, 2017
INVENTOR(S)      : Bo Sun et al.

Page 1 of 1

It is certified that error appears in the above-identified patent and that said Letters Patent is hereby corrected as shown below:

In the Claims

Claim 7, Column 8 should be corrected as follows:
Line 59: Change:
-- hall-tone --
To:
"half-tone"

Claim 9, Column 9 should be corrected as follows:
Line 11: Change:
-- Film --
To:
"film"

Signed and Sealed this
Twelfth Day of September, 2017

Joseph Matal
*Performing the Functions and Duties of the*
*Under Secretary of Commerce for Intellectual Property and*
*Director of the United States Patent and Trademark Office*